US007812249B2

(12) United States Patent
King et al.

(10) Patent No.: US 7,812,249 B2
(45) Date of Patent: Oct. 12, 2010

(54) MULTIJUNCTION PHOTOVOLTAIC CELL GROWN ON HIGH-MISCUT-ANGLE SUBSTRATE

(75) Inventors: Richard R. King, Thousand Oaks, CA (US); James H. Ermer, Burbank, CA (US); Peter C. Colter, Canyon Country, CA (US); Chris Fetzer, Valencia, CA (US)

(73) Assignee: The Boeing Company, Chicago, IL (US)

(*) Notice: Subject to any disclaimer, the term of this patent is extended or adjusted under 35 U.S.C. 154(b) by 1153 days.

(21) Appl. No.: 10/413,906

(22) Filed: Apr. 14, 2003

(65) Prior Publication Data

US 2004/0200523 A1 Oct. 14, 2004

(51) Int. Cl.
*H01L 31/00* (2006.01)
(52) U.S. Cl. ........................... 136/255; 136/262
(58) Field of Classification Search ............... 136/262, 136/255; 257/53–56, 184–189; 438/57–98
See application file for complete search history.

(56) References Cited

U.S. PATENT DOCUMENTS

| 4,915,744 A | * | 4/1990 | Ho et al. ............ 136/262 |
| 5,223,043 A | | 6/1993 | Olson et al. |
| 5,405,453 A | * | 4/1995 | Ho et al. ............ 136/249 |
| 5,952,703 A | | 9/1999 | Murakami et al. |

FOREIGN PATENT DOCUMENTS

EP 04 00 8813 5/2008

OTHER PUBLICATIONS

King, R.R. et al, "Next-Generation, High-Efficeincy III-V Multijunction Solar Cells" Conf. Rec. 28th PV Spec. Conf., 998-1001. (2000).*
Yamaguchi, M. "Physics and technologies of superhigh-efficiency tandem solar cells". Semiconductors. 33(9), 961-964. (1999).*
H. Henzler et al, "2.3.2.1.2 Group IV Semiconductors", in Landolt-Bomstein—Group III Condensed Matter, vol. 24a, pp. 278-283. (1993).*
A.A. Baski et al, "The structure of silicon surfaces from (001) to (111)", Surf. Sci., 392, 69-85. (1997).*
T. Suzuki, A. Gomyo. and Sumio Iijima, "Sublattice Ordering in GaInP and AlGaInP: Effects of Substrate Orientation," *J. Crystal Growth* 99 (1990), pp. 60-67.
S. R. Kurtz, J. M. Olson, D. J. Arent, A. E. Kibbler, and K. A. Bertness, "Competing Kinetic and Thermodynamic Processes in the Growth and Ordering of $Ga_{0.5}In_{0.5}P$," *Mat. Res. Soc. Symp. Proc.*, vol. 312, Materiels Research Society, Warrendale, PA (1993).
Stringfellow, G.B., MRS Bulletin, Jul. 1997, pp. 27-32.

* cited by examiner

*Primary Examiner*—Jeffrey T Barton
(74) *Attorney, Agent, or Firm*—Tung & Associates

(57) ABSTRACT

The present invention provides a photovoltaic cell comprising a GaInP subcell comprising a disordered group-III sublattice, a Ga(In)As subcell disposed below the GaInP subcell, and a Ge substrate disposed below the Ga(In)As subcell comprising a surface misoriented from a (100) plane by an angle from about 8 degrees to about 40 degrees toward a nearest (111) plane.

14 Claims, 5 Drawing Sheets

MULTIJUNCTION PHOTOVOLTAIC CELL GROWN ON HIGH-MISCUT-ANGLE SUBSTRATE

GOVERNMENT INTERESTS

The United States Government has rights in this invention under Contract No. F29601-98-2-0207 between The Boeing Company and the U.S. Air Force.

BACKGROUND OF THE INVENTION

The present invention generally relates to semiconductor materials and, more specifically, to photovoltaic (PV) cells and optoelectronic devices grown on high-miscut-angle substrates.

The interest in PV cells or solar cells has been increasing due to concerns regarding pollution and limited available resources. This interest has been in both terrestrial and non-terrestrial applications. In space applications, the use of nuclear or battery power greatly increases a spacecraft's payload for a given amount of required power to operate the satellite. Increasing the payload of a spacecraft in this manner increases the cost of a launch more than linearly. With the ready availability of solar energy in outer space for a spacecraft such as a satellite, the conversion of solar energy into electrical energy may be an obvious alternative to an increased payload.

The cost per watt of electrical power generation capacity of photovoltaic systems may be a main factor, which inhibits their widespread use in terrestrial applications. Conversion efficiency of sunlight to electricity can be critically important for terrestrial PV systems, since increased efficiency usually results in a reduction of related electricity generation system components (such as cell area, module or collector area, support structures, and land area) for a given required power output of the system. For example, in concentrator photovoltaic systems which concentrate sunlight from around 2 to around 2000 times onto the PV cell, an increase in efficiency typically results in a proportionate reduction of an area comprising expensive concentrating optics.

To increase the electrical power output of such cells, multiple subcells or layers having different energy band gaps have been stacked so that each subcell or layer can absorb a different part of the wide energy distribution in the sunlight. This situation is advantageous, since each photon absorbed in a subcell corresponds to one unit of charge that is collected at the subcell operating voltage, which is approximately linearly dependent on the band gap of the semiconductor material of the subcell. Since the output power is the product of voltage and current, an ideally efficient solar cell would have a large number of subcells, each absorbing only photons of energy negligibly greater than its band gap.

The most efficient and therefore dominant multijunction (MJ) PV cell technology is the GaInP/Ga(In)As/Ge cell structure. Here the use of parentheses in the Ga(In)As middle subcell material indicates the incorporation of indium in the middle cell is optional, so that the composition of the middle cell may be either GaAs or GaInAs. These monolithic cells may be grown lattice-matched to GaAs or Ge, and may have only the top two junctions active with an inactive Ge substrate (2-junction cells), or all three junctions may be active (3-junction cells). While variations on this material system, such as AlGaInP or lattice-mismatched GaInP top cells, might provide a more ideal match of band gaps to the solar spectrum, practical considerations have indicated that lattice-matched GaInP is preferred for large-scale production. Addition of even small amounts of aluminum to the top cell to form AlInGaP simultaneously incorporates oxygen and thus quickly degrades the minority-carrier lifetime and performance of the device. Lattice-mismatched GaInP top cells induce dislocation formation having a similar effect.

In monolithic, series-interconnected, 2- and 3-junction GaInP/Ga(In)As/Ge solar cells, it is desirable for the GaInP top subcell to have nearly the same photogenerated current density as the Ga(In)As subcell. If the currents are different, the subcell with the lowest photogenerated current will limit the current through all of the series-interconnected subcells in the multifunction (MJ) cell, and excess photogenerated current in other subcells is wasted. Limiting the current in this manner results in a severe penalty on the MJ cell efficiency.

At the lattice constant of Ge (or of GaAs) substrates, GaInP grown under conventional conditions has an ordered group-III sublattice and therefore has a band gap which is too low to achieve the desired current match between subcells in the unconcentrated or concentrated AM0 space solar spectrum, the unconcentrated or concentrated AM1.5D and AM1.5G terrestrial solar spectra, and other solar spectra, unless the top subcell is purposely made optically thin, as in U.S. Pat. No. 5,223,043. To achieve the highest efficiencies, the thickness of the subcells in MJ cells are tuned to match the current in each subcell. It is preferable to current match the subcells by increasing the band gap of the top cell rather than reducing its thickness, producing a higher voltage at the same current. An important property of GaInP is that its band gap varies with growth conditions. GaInP grown under conventional conditions is GaInP with a $CuPt_B$ ordered group-III sublattice. The result of this ordering may be a decrease in band gap of up to 470 meV for completely ordered material compared with completely disordered material. A. Zunger, MRS Bulletin, 22, (1997) p. 20-26. Typically, this loss in band gap is only 120 meV since the ordering is only partial. The amount of ordering contained in a sample is described by the order parameter, $\eta$, which ranges from 0 (disordered) to 1 (completely ordered). G. B. Stringfellow, MRS Bulletin, 22, (1997) p. 27-32.

If the GaInP top cell is fully disordered, an optically thick top cell is nearly current matched for the AM1.5D and AM1.5G terrestrial spectra, but still must be slightly optically thin to match the AM0 spectrum. The increase $\Delta E_g$ in band gap results in an increase in open-circuit voltage $V_{oc}$ of approximately $\Delta E_g/q$ (typically 100 mV) for fully-disordered GaInP as compared to partially-ordered GaInP.

Whether in the multiple-junction or single-junction PV device, a conventional characteristic of PV cells has been the use of a window layer on an emitter layer disposed on the base of the PV cell. The primary function of the window layer is to reduce minority-carrier recombination (i.e., to passivate) the front surface of the emitter. Additionally, the optical properties of the window material must be such that as much light as possible is transmitted to lower cell layers where the photogenerated charge carriers can be collected more efficiently, or if there is substantial light absorption in the window, the minority-carrier lifetime in the window must be sufficiently long for the carriers to be collected efficiently at the p-n junction between the emitter and base of the PV cell. Similarly, a back-surface field (BSF) structure below the PV cell base has been used to reduce minority-carrier recombination at the back surface of the base. As for the window, the BSF structure (referred to here simply as a BSF, for brevity) must have optical properties which allow most of the light that can be used by the subcells beneath the BSF to be transmitted by the BSF, and/or the minority-carrier properties in the BSF must be such that electrons and holes which are generated by light absorption in the BSF are efficiently collected at the p-n junction of the PV cell.

For the multiple-cell PV device, efficiency may be limited by the requirement of low resistance interfaces between the individual cells to enable the generated current to flow from one cell to the next. Accordingly, in a monolithic structure, tunnel junctions have been used to minimize the blockage of current flow. In addition to providing the lowest resistance path possible between adjacent subcells, the tunnel junction should also be transparent to wavelengths of light that can be used by lower subcells in the MJ stack, because of the poor collection efficiency of carriers photogenerated in the tunnel junction region.

These properties are all dependent on the band gap, doping levels, optical properties, and minority-carrier recombination and diffusion properties of the base, emitter, window, BSF, and tunnel junction layers employed in the device. The semiconductor properties of these cell layers may be enhanced or degraded for a MJ PV device by the choice of substrate orientation.

Lightly-doped GaInP grown on the conventionally-used Ge substrates, i.e., with a surface orientation that is intentionally tilted by about 6° from the (100) plane toward one of the {111} planes, is quite highly ordered under the growth conditions typically used to produce it. Typically, the observed order parameter is about 0.5 for this case. Conventional methods to increase the output and efficiency of PV cells by disordering the GaInP top subcell of the PV cell include high zinc (Zn) doping and diffusion. Such Zn doping and diffusion, however, alters the material properties of the GaInP top subcell (and potentially other subcells and layers) resulting in non-ideal output and efficiency of the PV cell. A limitation of such a conventional method includes incomplete disordering of the GaInP group-III sublattice, resulting in a lower bandgap and cell voltage than possible with a more complete disordering. In addition, the top subcell device parameters and manufacturability of the MJ cell can be negatively impacted by the requirement to have a high Zn concentration in all or part of the base of the GaInP top subcell.

Another conventional method to increase the output and efficiency of PV cells includes disordering a GaInP top subcell of the PV cell by increasing the GaInP growth rate and growth temperature. In such situations, the disordering of the GaInP top subcell remains incomplete unless rather extreme growth conditions are used, thus placing constraints on the MJ cell growth process that are adverse to the cell's output and efficiency. For example, high growth temperature can degrade the performance of other subcells in the MJ stack, and high growth rates can impose inconveniently high levels of group-III source flows during growth.

The general effect of substrate orientation on sublattice disorder in GaInP has been previously described in the following references: "Sublattice Ordering in GaInP and AlGaInP: Effects of Substrate Orientation," by Suzuki, et al. and "Competing Kinetic and Thermodynamic Processes in the Growth and Ordering of $Ga_{0.5}In_{0.5}P$," by Kurtz, et al. Neither of these references, however, describe MJ photovoltaic cells with higher efficiency grown on high-miscut-angle substrates, than on conventionally-miscut substrates.

To successfully fabricate a MJ cell with a wide-bandgap GaInP top subcell due to substrate misorientation, the effect of misorientation on other materials growth and device properties should be understood, such as effects on nucleation, doping concentration, incorporation efficiency of gallium (Ga) and indium (In), etc., U.S. Pat. No. 4,915,744 describes single-junction GaAs cells on substrates that have a special orientation toward a crystallographic plane midway between the (110) and (111) crystallographic planes. No mention is made, however, of GaInP subcells and the effect of substrate misorientation on group-III sublattice ordering of GaInP.

As can be seen, there exists a need for improved single-junction and multifunction photovoltaic cells and other semiconductor devices grown on substrates having surfaces with a crystal orientation significantly misoriented with respect to the (100) plane (herein referred to as high-miscut-angle substrates or high-miscut substrates) in order to alter the materials properties of the grown semiconductor layers, and thereby improve the output and efficiency of PV cells or other type of semiconductor devices.

SUMMARY OF THE INVENTION

In one aspect of the present invention, a photovoltaic cell comprises a GaInP subcell comprising a disordered group-III sublattice base, a Ga(In)As subcell disposed below the GaInP subcell, and a semiconductor growth substrate, preferably Ge or GaAs, disposed below the Ga(In)As subcell comprising a surface misoriented from a (100) plane by an angle from about 8 degrees to about 40 degrees toward a nearest (111) plane.

In a preferred embodiment of the present invention, a photovoltaic cell comprises a GaInP subcell, a Ga(In)As subcell disposed below the GaInP subcell, and a semiconductor growth substrate such as Ge or GaAs disposed below the Ga(In)As subcell, the semiconductor growth substrate comprising a (115) surface misoriented from a (100) plane by an angle of approximately 15.8° toward a nearest (111) plane.

In another aspect of the present invention, a photovoltaic cell comprises an AlInP top subcell window layer; a GaInP top subcell emitter layer disposed below the AlInP top subcell window layer; a GaInP top subcell base layer disposed below the GaInP top subcell emitter layer; an AlGaAs or AlGaInP top subcell BSF layer disposed below the GaInP top subcell base layer; a tunnel junction structure, referred to as the top subcell tunnel junction structure, such as p-AlGaAs/n-GaInP, p-AlGaAs/n-GaAs, or p-GaAs/n-GaAs, disposed below the top subcell BSF layer; a middle subcell window structure such as a single GaInP layer or an AlInP/GaInP window structure disposed below the top subcell tunnel junction structure; a Ga(In)As middle subcell emitter layer disposed below the middle subcell window structure; a Ga(In)As middle subcell base layer disposed below the Ga(In)As middle subcell emitter layer; an AlGaAs or GaInP middle subcell BSF layer disposed below the Ga(In)As middle subcell base layer; a tunnel junction structure, referred to as the middle cell tunnel junction structure, such as p-AlGaAs/n-GaInP, p-AlGaAs/n-GaAs, or p-GaAs/n-GaAs, disposed below the middle cell BSF layer; a Ga(In)As buffer layer disposed below the middle cell tunnel junction structure; a GaInP or GaAs nucleation layer and bottom subcell window layer disposed below the Ga(In)As buffer layer; a Ge bottom subcell emitter layer disposed below the nucleation layer and bottom subcell window layer, and a Ge bottom subcell base layer and a high-miscut-angle substrate disposed below the Ge bottom subcell emitter layer, the substrate comprising surface misoriented from a (100) plane by an angle from about 8 degrees to about 40 degrees toward a nearest (111) plane.

In a further aspect of the present invention, a photovoltaic cell comprises a Ge substrate comprising a surface misoriented from a (100) plane by an angle from about 8 degrees to about 40 degrees toward a nearest (111) plane, and at least one of a following group of subcells disposed above the Ge substrate: GaInP/Ga(In)As/GaInNAs; GaInP (thin)/GaInP(As) (thick)/Ga(In)As; and GaInP (thin)/GaInP(As) (thick)/Ga(In)As/GaInNAs.

In yet another aspect of the present invention, a photovoltaic cell system comprises a solar array having at least one solar cell. The solar cell comprises a group-III-sublattice-disordered (referred to herein simply as disordered, for brevity) AlInP top subcell window layer; a disordered GaInP top subcell emitter layer disposed below the AlInP top subcell window layer; a disordered GaInP top subcell base layer disposed below the GaInP top subcell emitter layer; an AlGaAs or disordered AlGaInP top subcell BSF layer disposed below the GaInP top subcell base layer; a tunnel junction structure, referred to as the top subcell tunnel junction structure, such as p-AlGaAs/disordered n-GaInP, p-AlGaAs/n-GaAs, or p-GaAs/n-GaAs, disposed below the top subcell BSF layer; a middle subcell window structure such as a single disordered GaInP layer, or a disordered AlInP/disordered GaInP window structure disposed below the top subcell tunnel junction structure; a Ga(In)As middle subcell emitter layer disposed below the middle subcell window structure; a Ga(In)As middle subcell base layer disposed below the Ga(In)As middle subcell emitter layer; an AlGaAs or disordered GaInP middle subcell BSF layer disposed below the Ga(In)As middle subcell base layer; a tunnel junction structure, referred to as the middle cell tunnel junction structure, such as p-AlGaAs/n-GaInP, p-AlGaAs/n-GaAs, or p-GaAs/n-GaAs, disposed below the middle cell BSF layer; a Ga(In)As buffer layer disposed below the middle cell tunnel junction structure; a GaInP or GaAs nucleation layer and bottom subcell window layer disposed below the Ga(In)As buffer layer; a Ge bottom subcell emitter layer disposed below the nucleation layer and bottom subcell window layer, and a Ge bottom subcell base layer and a high-miscut-angle substrate disposed below the Ge bottom subcell emitter layer, the substrate comprising a surface misoriented from a (100) plane by an angle from about 8 degrees to about 40 degrees toward a nearest (111) plane.

In yet a further aspect of the present invention, a satellite system comprises a satellite and a solar cell array operably coupled to the satellite, the solar cell array having at least one photovoltaic cell comprising a disordered AlInP top subcell window layer; a disordered GaInP top subcell emitter layer disposed below the AlInP top subcell window layer; a disordered GaInP top subcell base layer disposed below the GaInP top subcell emitter layer, having a bandgap of approximately 1.9 eV; a tunnel junction structure beneath the top cell that may include a disordered GaInP layer; a middle cell window structure that may include a disordered GaInP layer; a Ga(In)As middle cell emitter layer and base layer; a middle cell BSF structure that may include a disordered GaInP layer; a tunnel junction structure beneath the middle cell; a Ga(In)As buffer layer a GaInP or GaAs nucleation layer and bottom subcell window layer; a Ge bottom subcell emitter layer; and a Ge bottom subcell base layer and a high-miscut-angle substrate comprising a surface misoriented from a (100) plane by an angle from about 16 degrees toward a nearest (111) plane.

In another aspect of the present invention, a method for increasing a GaInP top subcell bandgap comprises providing a Ge substrate with a 15.8 degree miscut angle from the {100} orientation, growing a photovoltaic cell, including the GaInP top subcell, on the Ge substrate, and positioning the miscut angle of 15.8 degrees from the (100) plane toward a {111} plane, resulting in a {511} orientation of the substrate surface, thus disordering and increasing the bandgap of the GaInP top subcell. The use of brackets { } indicates sets of crystallographic planes that are symmetrically equivalent.

In another aspect of the present invention, a method for producing a shorter cutoff wavelength for the external quantum efficiency of a GaInP top subcell comprises providing a Ge substrate with a 15.8 degree miscut angle, and growing the disordered GaInP top subcell on the 15.8°-miscut Ge substrate, resulting in a high bandgap and a quantum efficiency percentage of about zero by a wavelength of about 675 nm.

In a further aspect of the present invention, a method for increasing a conversion efficiency in a solar cell comprises providing a Ge substrate with a 15.8 degree miscut angle, and growing a GaInP top subcell on the 15.8°-miscut Ge substrate, resulting in an conversion efficiency under the AM0 spectrum of about 28% or higher and an open-circuit voltage of about 2.7 V.

These and other features, aspects and advantages of the present invention will become better understood with reference to the following drawings, description and claims.

DETAILED DESCRIPTION OF THE INVENTION

The following detailed description describes the best currently contemplated modes of carrying out the invention. The description should not be taken in a limiting sense, but is made merely for the purpose of illustrating the general principles of the invention, since the scope of the invention is best defined by the appended claims.

The present invention generally provides a high-efficiency MJ photovoltaic cell (such as a GaInP/Ga(In)As/Ge cell) that may be used with, for example, a satellite. Such a high-efficiency MJ photovoltaic cell results from an increased bandgap of the GaInP subcell, due to an increased sublattice disorder induced by growth on a substrate misoriented from a (100) plane toward a (111) plane. Any of the aforementioned conventional methods for disordering GaInP (and other III-V compounds) can be used in conjunction with disordering due to growth on high-miscut-angle substrates of the present invention.

Figure 1:
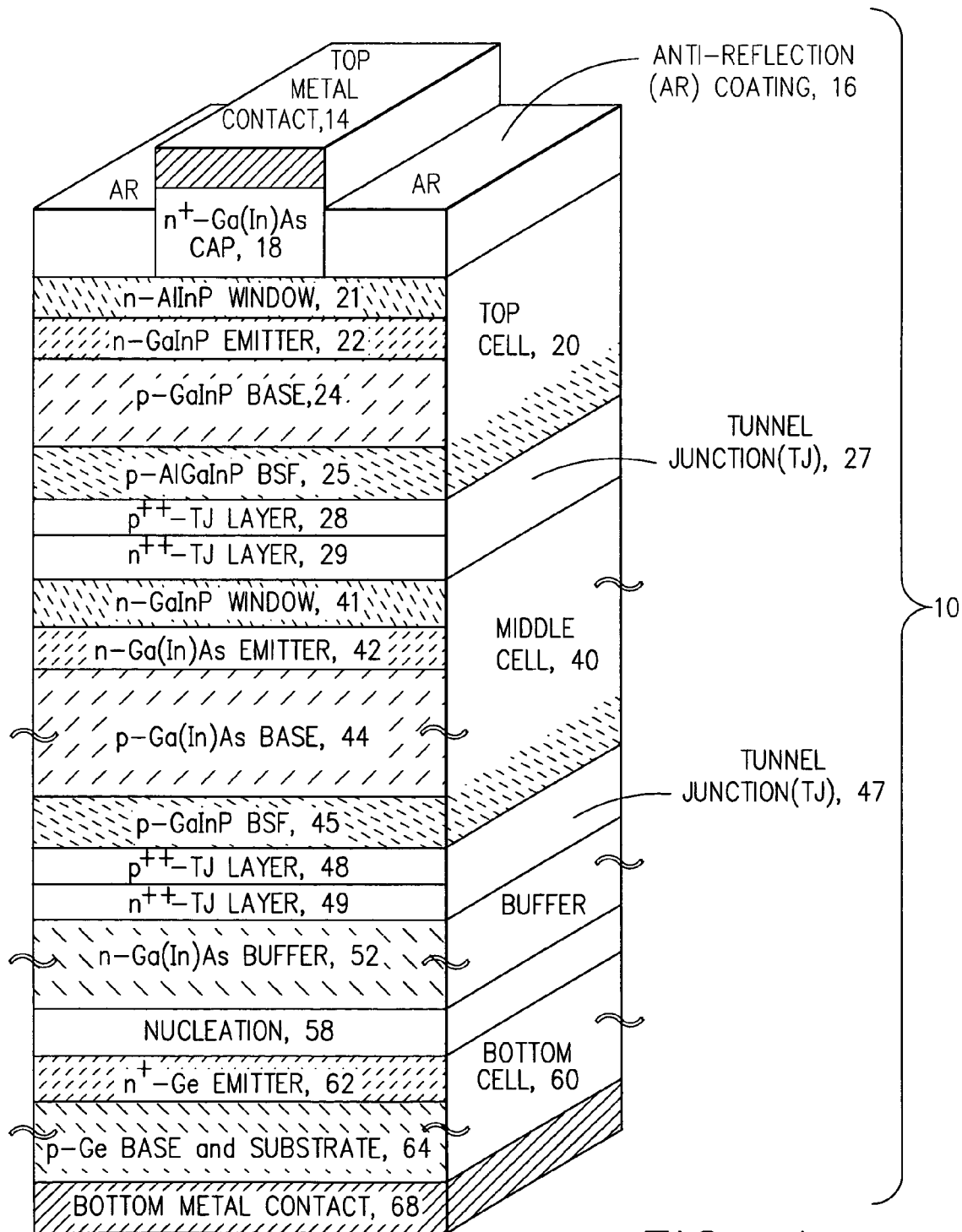
FIG. 1 is a cross-section of a 3-junction photovoltaic cell in accordance with the present invention.

Referring now to FIG. 1, a cross-section of a MJ photovoltaic cell 10 is presented. The MJ cell 10 may include three subcells, 20, 40, and 60, connected in electrical series. These subcells 20, 40, 60 are referred to according to the material of their respective base layer 24, 44, 64. For instance, the MJ cell 10 may be composed of a GaInP subcell 20 with a GaInP base layer 24, a Ga(In)As subcell 40 with a Ga(In)As base layer 44 (where the parentheses around In indicate that the base may be composed of GaInAs or GaAs), and a Ge subcell 60 with a Ge base layer 64 composed of a Ge growth substrate.

The subcells 20, 40, 60 may also be referred to by the order in which light strikes each subcell as it enters the front of the MJ cell 10. For instance in FIG. 1, the subcell 10 may also be referred to as the top subcell or subcell 1, the subcell 40 may be referred to as the middle subcell or subcell 2, and the Ge subcell 60 as the bottom subcell or subcell 3. In general, n subcells may be connected in series, where n may be equal to 1 for a single-junction cell, or n may be any integer greater than or equal to 2 for a multijunction cell. The growth substrate may be electrically inactive, or, it may be electrically active, thereby forming one of the n subcells in the multijunction cell.

For example, the Ge subcell 60 can be formed from a Ge wafer that serves as a substrate for epitaxial growth of the semiconductor layers that form the upper subcells. The Ge wafer further serves as the main mechanical support for the cell, in addition to serving as one of the three active subcells in the 3-junction cell 10. The epitaxial growth of semiconductor layers on the substrate may be initiated with a nucleation layer 58, and a buffer region 52, which may contain one or more semiconductor layers. Such growth typically occurs between the nucleation layer 58 and the lowermost epitaxial subcell (such as the middle cell 40). The tunnel junction between the lowermost epitaxial subcell and the substrate may be placed either above, beneath, or in the body of buffer region. For example, the tunnel junction 47 is shown above the buffer region 52.

The tunnel junction 27 connects the top subcell 20 and the middle subcell 40 in electrical series, and the tunnel junction 47 connects the middle subcell 40 and the bottom subcell 60 in electrical series. In general, each of the n subcells in a MJ cell, such as MJ cell 10, may be connected in series to the adjacent subcell(s) by a tunnel junction in order to form a monolithic, two-terminal, series-interconnected MJ cell. In a two-terminal configuration it can be desirable to design the subcell thicknesses and bandgaps such that each subcell has nearly the same current at the maximum power point of the current-voltage curve of each subcell, in order that one subcell does not severely limit the current of the other subcells. Alternatively, the subcells may be contacted by means of additional terminals, for instance, metal contacts to laterally conductive semiconductor layers between the subcells, to form 3-terminal, 4-terminal, and in general, m-terminal MJ cells (m being an integer greater than or equal to 2, and less than or equal to 2n, where n is the number of active subcells in the MJ cell). The subcells can be interconnected in circuits using these additional terminals such that most of the available photogenerated current density in each subcell can be used effectively. Such effective use may lead to high efficiency for the MJ cell, even if the photogenerated current densities are very different in the various subcells.

The window, emitter, base, and back-surface field (BSF) layers are shown in each of the subcells 20, 40, and 60. The window, emitter, base, and BSF layers in the top cell 20 are layers 21, 22, 24, and 25, respectively, and in the middle cell 40 they are layers 41, 42, 44, and 45, respectively.

The nucleation layer 58 can also serve as a window layer for the Ge subcell 60. Additionally, the buffer region 52 may be considered as part of the window of the Ge subcell 60, though it includes other functions as well, such as reducing crystal defects and improving morphology in the upper epitaxially-grown layers of the MJ cell 10. The emitter layer 62 of the Ge subcell 60 can be formed by diffusion into the p-type Ge substrate of column-V elements (which are n-type dopants in Ge) from the epitaxial growth of the III-V semiconductors on top of the Ge substrate. The base 64 of the Ge subcell 60 consists of the bulk of the p-type Ge wafer which also serves as the growth substrate and mechanical support for the rest of the MJ cell 10. Although, no BSF layer appears on the back of the Ge subcell 60, a BSF layer (such as a diffused $p^+$ region, or an epitaxially-grown group-IV or III-V semiconductor layer) may be positioned in such a location to improve the efficiency of the Ge subcell 60, as well as the overall MJ cell 10 efficiency.

The photogenerated current leaves the respective subcell through contacting layers, which are typically heavily-doped semiconductor layers, but may be composed of other types of conductive material, such as conductive oxides or metal, which may be transparent or opaque over different wavelength ranges. The contacting layers for the top subcell 20 are the cap layer 18 on the front of the subcell 20 (which in turn is contacted by the metal grid pattern 14 on the top of the MJ cell 10), and the $p^{++}$-doped side 28 of the tunnel junction 27 on the back surface of the top subcell 20. The contacting layers for the middle subcell 40 are the $n^{++}$-doped side 29 of the tunnel junction 27 on front of the middle subcell 40, and the $p^{++}$-doped side 48 of the tunnel junction 47 on the back surface of the middle subcell 40. The contacting layers for the Ge bottom subcell 60 are the $n^{++}$-doped side 49 of the tunnel junction 47 on front of the buffer region 52 (provided that the buffer region 52 is considered to be part of the window structure for the Ge subcell 60), and the back metal contact 68 on the back surface of the bottom subcell 60 (which can also be considered the back surface of the entire MJ cell 10). These contacting layers may be unpatterned, as in the case of the back metal contact 68 on the bottom subcell 60, or a transparent conductive oxide contacting the top cell window 21 or emitter 22, in place of a more conventional solar cell grid. The contacting layers may also be patterned, as in the case of the patterned heavily-doped cap 18 and metal contact 14 that form the front grid of most solar cells. An anti-reflection coating 16 can be provided on the PV cell's 10 front (sunward) surface (and, for example, disposed above the AlInP window layer 21), and may be typically made up of one, two, or more dielectric layers with thicknesses optimized to maximize transmission of light through the front surface over the range of wavelengths to which the PV cell can be responsive.

The lateral conductivity of the emitter and window layers between gridlines can be important, since after minority carriers in the base (minority electrons in the case of the p-type top cell base 24) are collected at the base/emitter p-n junction between the gridlines, the collected carriers, which are now majority carriers in the emitter (majority electrons in the n-type top cell emitter 22), must be conducted to the gridlines with minimum resistive loss. Both the top cell emitter layer 22 and window layer 21 take part in this lateral majority-carrier conduction to the gridlines. While maintaining this high conductivity, the window 21 and emitter layers 22 should remain highly transmissive to photon energies that can be used effectively by the base 24 of the top cell 20 and by the other active subcells 40, 60 in the MJ cell 10. Further, the window 21 and emitter layers 22 should have a long diffusion length for minority-carriers that are photogenerated in the window 21 and emitter layers 22 (minority holes in the case of the n-type emitter 22), so that they may be collected at the p-n junction before recombining. Since the transmittance and diffusion length both tend to decrease for high doping levels, an optimum doping level typically exists at which cell efficiency can be maximized, for which the conductivity of the window 21 and emitter layer 22 can be high enough that resistive losses are small compared to the power output of the cell 20, and yet the transmittance and minority-carrier collection in the window 21 and emitter layer 22 are high enough that most of the photons incident on the cell 20 generate useful current.

The highly-doped layers that form the tunnel junctions between cells, with their very low sheet resistance, also serve as lateral conduction layers. Such conduction layers help to make the current density across the MJ cell 10 more uniform in the case of spatially non-uniform intensity or spectral content of the light incident on the cell. Laterally-conductive layers between the subcells 20, 40, and on the back of the bottom cell 60, are also very important in the case of MJ cell designs which have more than two terminals. For example, in mechanically-stacked or monolithically-grown MJ cells, with 3, 4, or more terminals, the subcells operate at current densities that are not all necessarily the same in order to optimize the efficiency of each subcell and hence of the entire MJ cell. Laterally-conductive regions between the subcells 20, 40 and at the back of the bottom cell 60 are also important for configurations with 3, 4, or more terminals in which the subcells are interconnected with other circuit elements, such as bypass or blocking diodes, or in which the subcells from one MJ cell are connected with subcells in another MJ cell, in series, in parallel, or in a combination of series and parallel, in order to improve the efficiency, voltage stability, or other performance parameter of the photovoltaic cell circuit.

Note that a variety of different semiconductor materials may be used for the window layers 21, 41, 52, and 58 (the layer 52 can provide the buffer region, and the layer 58 can provide the nucleation layer, but they also serve as window layers for the bottom cell 60), the emitter layers 22, 42, 62, the base layers 24, 44, 64 and/or the BSF layers 25, 45, including AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, Ge, Si, SiGe, ZnSSe, CdSSe, and other materials and still fall within the spirit of the present invention. Additionally, while the growth substrate and base layer 64 may preferably be a p-Ge growth substrate and base layer, other semiconductor materials may be used as the growth substrate and base layer 64, or only as a growth substrate. These include, but are not limited to, GaAs, InP, GaSb, InAs, InSb, GaP, Si, SiGe, SiC, $Al_2O_3$, Mo, stainless steel, soda-lime glass, and $SiO_2$.

In 2- and 3-junction GaInP/Ga(In)As/Ge photovoltaic cells, the GaInP top subcell may have a lower open-circuit voltage, $V_{oc}$, and lower voltage at the maximum-power point of its I-V curve, $V_{mp}$, if its bandgap is lower, as can result when it is formed of GaInP with an ordered group-III sublattice (called ordered GaInP). Higher values of $V_{oc}$ and $V_{mp}$, and hence higher efficiencies can be achieved for the GaInP top subcell and for the multifunction cell in which it resides if it is composed of GaInP with a disordered group-III sublattice (called disordered GaInP).

In monolithic, series-interconnected, 2- and 3-junction GaInP/Ga(In)As/Ge solar cells it may be desirable for the GaInP-base top (1st) subcell to have nearly the same photogenerated current density as the Ga(In)As-base 2nd subcell. At the lattice constant of Ge (or of GaAs) substrates, the bandgap of GaInP with an ordered group-III sublattice can be too low to achieve this current match in the AM0 space solar spectrum, the unconcentrated or concentrated AM1.5D or AM1.5G terrestrial solar spectra, and other solar spectra, unless the top subcell can purposely be made optically thin. Because the subcell with the lowest photogenerated current will limit the current through all of the series-interconnected subcells in the multifunction (MJ) cell, the excess photogenerated current in other subcells may be wasted. This has a severe penalty on the MJ cell efficiency, so to achieve the highest efficiencies, the thicknesses of the subcells in MJ cells are generally tuned to match the current in each subcell. Since the photogenerated current densities in the subcells are made the same by design of the MJ cell, it may be important for the top subcell to convert that current at as high a voltage as possible, and therefore, the higher-bandgap GaInP that results from disorder of the group-III sublattice may be desirable for maximizing the MJ cell efficiency. The high bandgap of disordered GaInP allows a larger fraction of the photons with energy above the bandgap energy be used to create electron-hole pairs in the top cell, rather than have part of their energy wasted by being transmitted through the top subcell and converted by the lower bandgap Ga(In)As subcell 2.

In some types of MJ photovoltaic cells, the ratio of current in the GaInP top subcell divided by the current in the Ga(In)As second subcell (called the J-ratio) can be adjusted to be different from unity during the fabrication of the cell, so that when one subcell degrades more rapidly than the other over the life of the MJ cell (for example, the Ga(In)As second subcell can degrade faster than the top subcell when exposed to radiation in space), the J-ratio will be closer to unity on average over the entire life of the MJ cell. The higher bandgap and voltage of a disordered GaInP top subcell may be an advantage in this case where the J-ratio is initially different from unity, as well as in the current-matched case (where the J-ratio equals unity) previously described.

By disordering the group-III sublattice of Ga and In atoms in GaInP, the bandgap of GaInP lattice-matched to Ge (with a composition of approximately $Ga_{0.505}In_{0.495}P$) or to GaAs (with a composition of approximately $Ga_{0.515}In_{0.485}P$) the bandgap of GaInP can be increased by roughly 100 meV, without changing the composition or lattice constant of the GaInP. Thus, by changing the ordering state of the group-III sublattice from highly-ordered to highly-disordered, the bandgap of $Ga_{0.505}In_{0.495}P$ lattice-matched to Ge can be increased from about 1.785 eV to about 1.815 eV to 1.935 eV and preferably to about 1.885 eV, and the bandgap of $Ga_{0.515}In_{0.485}P$ lattice-matched to GaAs can be increased from about 1.800 eV to about 1.83 eV to 1.95 eV and preferably to about 1.900 eV.

The ordering of the group-III or group-V sublattice of a III-V semiconductor (or for that matter, of the group-II or group-VI sublattice of a II-VI semiconductor, the group-IV sublattice of a compound group-IV semiconductor, or similar sublattices of other types of semiconductors such as I-III-VI semiconductors), and the effect that such ordering has on the control of bandgap, and conduction and valence band offsets at heterojunctions, are influenced a wide variety of epitaxial growth conditions. These include growth temperature, growth rate, dopant and other impurity concentration, dopant and other impurity diffusion, injection of point defects in the crystal lattice during growth such as interstitial atoms or atomic vacancies from adjacent layers in the semiconductor device structure, and other growth parameters. These growth conditions often influence other semiconductor parameters that are very important to device design, such as semiconductor crystal quality, minority-carrier lifetime, minority- and majority-carrier mobility, ability to dope at a desired concentration with a given doping, auto-doping from other layers in the structure including the substrate, control of morphology, ease of nucleation, heterointerface properties, cost of epitaxy, and other device design considerations. The growth conditions that are most desirable for device properties other than the GaInP ordering are often those conditions which result in low-bandgap, ordered GaInP.

The use of high-miscut-angle substrates as described in present invention provides a way to disorder semiconductor layers in a device structure, in particular, to disorder the group-III sublattice of GaInP in a device structure, in a way that does not require changes to the growth parameters described above which may compromise device performance. An important, and non-obvious practical aspect of implementing the present invention is the requirement to optimize some growth conditions such as the relative concentrations of group-III reactants and dopant reactants in the gas phase in order to achieve the desired compositions and doping concentrations for layers grown on high-miscut-substrates. However, these growth condition changes are typically much smaller, and therefore less disruptive, than growth condition changes that would be required to alter the ordering state of the semiconductor. The use of growth substrates with the high-miscut angles of the present invention provide a way to control not only the group-III sublattice disorder of GaInP, but also the group-II and group-V sublattice disorder of other III-V semiconductors such as GaInP, GaInAs, GaAsSb, GaPAs, GaInPAs, GaInSb, GaInPSb, GaInN, AlGaN, AlInN, GaInNP, GaInNAs, GaInNAsSb, AlInP, AlGaInP, AlGaAs, AlGaInAs, AlGaAsSb, AlGaPAs, AlInAs, InPAs, AlInPAs, AlInSb, and AlInPSb, as well as the sublattice disorder in II-VI semiconductors, compound group-IV semiconductors, I-III-VI semiconductors, etc., such as CdZnSe, CdZnTe, ZnSSe, ZnSeTe, SiGe, SiC, CuGaInSe, CuGaInSSe, AgGaInSe, etc.

The problems noted above also apply for other types of multijunction cells as well, such as GaInP/GaAs/GaInNAs/Ge 4-junction cells, in which it may be desirable to increase the bandgap of the GaInP (or AlGaInP) top subcell to increase voltage and improve current matching. In one embodiment of the present invention, a monolithic, series-interconnected, two-junction or 3-junction GaInP/Ga(In)As/Ge solar cell may be grown with a GaInP top subcell having a high-bandgap, GaInP top subcell base with a disordered group-III sublattice, by virtue of being grown on a Ge substrate that has a surface that may be misoriented from the (100) plane by an angle ranging from about 10 degrees to about 40 degrees (referred to as a high miscut angle) toward the nearest (111) plane, preferably by an angle of 15.8 degrees toward the (111) plane, such that the Ge substrate has a (115) surface.

Relatively small deviations in an azimuthal angle of the misorientation (for example, the difference between a misorientation toward the (111) plane and a misorientation toward a plane midway between the (110) and (111) planes) can have negative effects on GaInP/Ga(In)As/Ge MJ cell voltage and efficiency. These negative effects appear even for a same polar angle of misorientation (for example, 15.8 degrees from the (100) orientation) which when misoriented toward the (111) plane, results in a (511) surface orientation.

In other embodiments, the high-miscut-angle of the substrate can be used to achieve the following disordered (high-bandgap) structures in a MJ cell, either alone or in combination with each other and a high-bandgap GaInP top subcell base: a GaInP top subcell emitter, a AlInP top subcell window, a AlGaInP top subcell BSF, a GaInP tunnel junction layer, a AlInP window 2 layer on the Ga(In)As 2nd subcell, a GaInP window 1 layer on the Ga(In)As 2nd subcell, a GaInP heterojunction emitter in the Ga(In)As 2nd subcell, a GaInP BSF layer on the Ga(In)As 2nd subcell, and a GaInP nucleation layer and window layer on the Ge bottom (3rd) subcell.

The improvements offered by the present invention apply for other types of MJ cells as well, such as GaInP/GaAs/GaInNAs/Ge 4-junction cells, in which it may be desirable to increase the bandgap of the GaInP (or AlGaInP) top subcell to increase its voltage and improve current matching. Other examples include GaInP (thin)/GaInP(As) (thick)/Ga(In)As 3-junction cells, GaInP (thin)/GaInP(As) (thick)/Ga(In)As/Ge 4-junction cells, and GaInP (thin)/GaInP(As) (thick)/Ga(In)As/GaInNAs/Ge 5-junction cells, with high bandgap GaInP and GaInP(As) layers due to growth on high-miscut-angle substrates.

In other embodiments, the high-miscut-angle of the substrate can be used to produce the following advantageous features in single-junction or MJ photovoltaic cells, and other optoelectronic or electronic devices:

increased doping levels in tunnel junction layers (for example in a GaInP:tellurium (Te) n-type side of a tunnel junction layer, and in AlGaAs:carbon (C) p-type side of a tunnel junction layer);

increased doping levels, incorporation and activation fractions, in window and emitter layers (for example, Si, Se, or Te doping in an n-type GaInP middle cell window, Si, Se, or Te doping in an n-type GaInP top cell emitter, and Zn doping in a p-type AlGaInP or AlInP top cell BSF;

increased minority-carrier lifetime in the Ga(In) As base, particularly for 1%-In composition, of a Ga(In)As layer or subcell lattice-matched to a 15.8°-miscut Ge substrate, as compared to a conventional 6°-miscut substrate, measured by time-resolved photoluminescence;

increased Ga(In)As photovoltaic cell voltage on a 15.8°-miscut Ge substrate, as compared to a conventional 6°-miscut substrate, measured by illuminated I-V measurements;

improved surface morphology of grown semiconductor layers, reduced surface defects, reduced haze;

increased growth rate of GaInP, due to an increased Ga sticking coefficient;

improved mechanical strength and therefore improved yield through device fabrication processes;

influence on disordering or ordering on the group-V sublattice, such as in GaAsP, GaAsSb, or GaPSb;

influence on disordering or ordering on the group-II or group-VI sublattice of II-VI semiconductors;

influence on disordering or ordering of group-IV elements in mixed-group-IV semiconductors such as SiGe;

influence on disordering or ordering on the group-I, group-III, or group-VI sublattice of I-III-VI semiconductors;

misorientation of the (100) surface toward the nearest {111} plane, toward the (111)A plane or (111)B plane if grown on a III-V compound substrate such as GaAs, toward planes other than {111} such as {110}, or in general, misorientation toward the continuum of planes between {111} planes; and growth on a variety of substrates such as Ge, Si, SiGe, GaAs, GaP, GaSb, InP, InAs, InSb, SiC, $Al_2O_3$, CdTe, ZnTe, ZnSe, CdS, ZnS, ZnO.

Other methods of inducing group-ill sublattice disorder such as high Zn doping, Zn diffusion, point defect (interstitial or vacancy) diffusion, growth conditions (growth rate, growth temperature, III/V ratio, etc.), surfactants (Sb, Bi, etc.) introduced during growth, and others can be combined with the disordering by growth on high-miscut-angle growth substrates in accordance with the present invention.

Additionally, optoelectronic and electronic devices are envisioned that make use of the disorder (e.g., group-ill sublattice disordering) and high bandgap (e.g., in III-V semiconductors) achieved on high-miscut-angle substrates, such as:

photodetectors with higher bandgap window layers due to disordering; heterojunction bipolar transistors (HBTs) with higher bandgap emitters, collectors, and/or possible heavier doping in the base; high-electron-mobility transistors (HEMTs) that make use of the higher bandgap of the gate layer and different band offset between the gate and channel layers that results from disordering; semiconductor edge-emitting lasers and vertical-cavity surface-emitting lasers (VCSELs) with higher bandgap lasing regions and/or higher bandgap charge confinement layers and/or higher refractive index contrast for light confinement or Bragg reflectors resulting from disordering; photonic waveguide devices with different refractive index contrast or sensitivity of index to applied electric field as a result of disordering; avalanche photodiodes (APDs) with higher bandgap and/or different electron/hole ionization ratios in the multiplication layer or other regions resulting from disordering; and quantum well photovoltaic cells, lasers, and other devices with higher bandgap barrier layers for the wells resulting from disordering.

Referring again to FIG. 1, one embodiment of the MJ PV cell 10 of the present invention may comprise semiconductor layers including a AlInP top subcell window layer 21, a GaInP top subcell emitter layer 22 disposed below the AlInP top subcell window layer, a GaInP top subcell base layer 24 disposed below the GaInP top subcell emitter layer, a AlGaInP or AlGaAs top subcell BSF layer 25 disposed below the GaInP top subcell base layer, a tunnel junction 27 comprising a GaInP tunnel junction layer disposed below the top subcell BSF layer, a GaInP, AlInP, or AlInP/GaInP middle subcell window layer 41 disposed below the tunnel junction 27, a Ga(In)As middle subcell emitter layer 42 disposed below the middle subcell window layer, a Ga(In)As middle subcell base layer 44 disposed below the Ga(In)As middle subcell emitter layer, a GaInP or AlGaAs BSF layer 45 disposed below the Ga(In)As middle subcell base layer, a tunnel junction 47 comprising a Ga(In)As tunnel junction layer disposed below the middle subcell BSF layer, a Ga(In)As buffer layer 52 disposed below the tunnel junction 47, a GaInP nucleation layer and window layer 58 disposed below the Ga(In)As buffer layer, a Ge bottom subcell emitter layer 62 disposed below the GaInP nucleation layer and window layer, and a Ge bottom subcell base layer and high-miscut-angle substrate disposed below the Ge bottom subcell emitter layer, the substrate comprising a (115) surface.

In a further embodiment, the MJ PV cell 10 of the present invention may comprise high-bandgap, disordered layers including a AlInP top subcell window layer 21, a GaInP top subcell emitter layer 22 disposed below the AlInP top subcell window layer, a GaInP top subcell base layer 24 disposed below the GaInP top subcell emitter layer, a AlGaInP top subcell BSF layer 25 disposed below the GaInP top subcell base layer, a tunnel junction 27 comprising a GaInP tunnel junction layer disposed below the top subcell BSF layer, a GaInP, AlInP, or AlInP/GaInP middle subcell window layer 41 disposed below the tunnel junction 27, a GaInP BSF layer 45 disposed below the Ga(In)As middle subcell base layer, a GaInP nucleation layer and window layer 58 disposed below the Ga(In)As buffer layer, a Ge bottom subcell emitter layer 62 disposed below the GaInP nucleation layer and window layer, and further comprise a Ge bottom subcell base layer and high-miscut-angle substrate disposed below the Ge bottom subcell emitter layer, the substrate comprising a (115) surface.

The PV MJ cell 10 further comprises a heavily-doped cap contacting layer 18 disposed above the AlInP top subcell window layer 21, a metal contact 14 disposed above the heavily-doped cap contacting layer, and a metal contact 68 disposed below the Ge bottom subcell base layer 64. In other embodiments, a AlInP middle subcell window layer (not shown) may be disposed between the GaInP tunnel junction layer 27 and the Ga(In)As middle subcell emitter layer 42, a GaInP heterojunction emitter layer (not shown) may be disposed between the GaInP middle subcell window layer 41 and the Ga(In)As middle subcell base layer 44.

In another embodiment, a photovoltaic cell comprises a GaInP subcell comprising a disordered group-III sublattice base, a Ga(In)As subcell disposed below the GaInP subcell, and a Ge substrate disposed below the Ga(In)As subcell comprising a surface misoriented from a (100) plane by an angle from about 8 degrees to about 40 degrees toward a nearest (111) plane. Also, the Ge substrate may comprise a surface misoriented from the (100) plane by an angle from about 14 degrees to about 18 degrees toward the nearest (111) plane. Further, the Ge substrate may comprise a surface misoriented from the (100) plane by an angle of about 16 degrees toward the nearest (111) plane. Still further, the Ge substrate may comprise a surface misoriented from the (100) plane by an angle of 15.8 degrees toward the nearest (111) plane. The surface of the Ge substrate comprises a (115) surface.

In a further embodiment, a photovoltaic cell comprises a GaInP subcell, a Ga(In)As subcell disposed below the GaInP subcell, and a Ge substrate disposed below the Ga(In)As subcell, the Ge substrate comprising a surface misoriented from a (100) plane by an angle from about 8 degrees to about 40 degrees. The Ge substrate surface may further be misoriented from the (100) plane by the angle from about 8 degrees to about 40 degrees toward at least one plane from a group of planes consisting of: a nearest {111} plane, a nearest {110} plane, and a continuum of planes between {111} planes. The Ga(In)As, GaInP and other semiconductors grown on this substrate may have surfaces misoriented from the (100) plane by an angle from about 8 degrees to about 40 degrees toward at least one plane from a group of planes consisting of: a nearest {111} plane, a nearest {110} plane, a (111)A plane, a (111)B plane, and a continuum of planes between {111} planes.

In yet a further embodiment, a photovoltaic cell comprises a Ge substrate comprising a surface misoriented from a (100) plane by an angle from about 8 degrees to about 40 degrees toward a nearest (111) plane, and at least one of a following group of subcells disposed above the Ge substrate: GaInP/Ga(In)As/GaInNAs, GaInP(thin)/GaInP(As)(thick)/Ga(In)As, and GaInP(thin)/GaInP(As)(thick)/Ga(In)As/GaInNAs.

Figure 2:
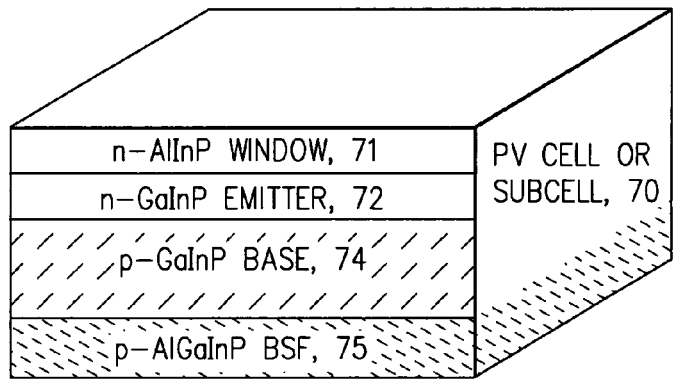
FIG. 2 is a cross-section of a basic semiconductor layer structure of a single-junction photovoltaic cell, or of a single subcell in a multifunction photovoltaic cell in accordance with the present invention.

Referring now to FIG. 2, a cross-section of the basic semiconductor layer structure (or PV cell) 70 of a single-junction photovoltaic cell, or of a single subcell of a MJ cell (such as subcell 20 of MJ PV cell 10), is presented comprising disordered AlInP window 71, GaInP emitter 72, GaInP base 74, and AlGaInP BSF 75 layers in accordance with the present invention.

The photovoltaic cell 70 (and each subcell in a multifunction cell) may be composed of an emitter layer 72 of a first doping type and a base layer 74 of a second doping type. For instance, if the emitter layer 72 is an n-type, then the base layer 74 is typically a p-type; and if the emitter layer 72 is a p-type, then the base layer 74 is typically an n-type, such that a p-n junction can be formed between the emitter layer 72 and the base layer 74. There may be variations in the doping concentration in the emitter 72 and/or base layers 74, typically with higher doping toward the front of the emitter layer 72 and lower doping in the portion of the emitter layer 72 that can be closer to the p-n junction, and higher doping toward the back of the base layer 74 and lower doping in the portion of the base layer 74 that can be closer to the p-n junction, in order to suppress minority-carrier concentration at the surfaces away from the p-n junction, and enhance minority-carrier flow toward the collecting p-n junction. The base layer 74 may be intrinsic or not-intentionally-doped over part or all of its thickness.

In addition to the basic components of the emitter layer 72 and base 74, a photovoltaic cell (and each subcell in a multi-junction cell) typically includes a window layer 71 on top of the emitter, and a BSF layer 75 on the back of the base. The window layer typically has the same doping type as the emitter, often has a higher doping concentration than the emitter, and may be desirable to have a higher bandgap than the emitter, in order to suppress minority-carrier photogeneration and injection in the window, thereby reducing the recombination that would otherwise occur in the window. It can also be highly desirable for the window layer 71 to form an interface with the emitter layer 72 with as few minority carriers and as few deep energy levels in the bandgap as possible that could participate in Shockley-Read-Hall recombination at the interface. Since crystal defects can cause these deep energy levels, the window layer 71 should be capable of forming an interface with the emitter layer 72 that has as few crystal defects as possible. This property of the window layer 71 of minimizing minority-carrier recombination at the emitter layer 72 surface can be referred to as emitter passivation.

A variety of different semiconductor materials may be used for the window 71, emitter 72, base 74 and/or BSF 75 layers of the photovoltaic cell, including AlInP, AlAs, AlP, AlGaInP, AlGaAsP, AlGaInAs, AlGaInPAs, GaInP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, Ge, Si, SiGe, ZnSSe, CdSSe, and other materials and still fall within the spirit of the present invention.

The emitter layer 72 may typically be thinner than the base layer 74 and positioned on the sunward side of the base layer 74, though some specialized cells also make use of back surface illumination incident on the back of the base. Most of the photogeneration of electron-hole pairs responsible for the cell current typically takes place in the base layer 74, though the photogenerated current density from the emitter layer 72 can also be significant in most cells, and in some specialized cells may exceed that in the base layer 74.

The photovoltaic cell 70 may be of either a homojunction or heterojunction design. In a homojunction design, the semiconductor material in the emitter layer and base layer has the same composition, with the exception of the different doping in the emitter layer 72 and base layer 74, and the same semiconductor bandgap. The PV cell 70 is presented as a homojunction cell. In a heterojunction design, the semiconductor material in the emitter layer has a different composition than that of the base layer, and/or has a different bandgap than that of the base layer, in addition to the different doping types in the emitter layer and base layer. The emitter layer composition in a heterojunction photovoltaic cell design may typically be chosen such that the emitter layer has a higher bandgap than the base layer in order to inhibit injection of the majority carriers in the base layer into the emitter layer (where they are minority carriers that can recombine, since the emitter layer and base layer are of opposite doping type). The emitter layer has a higher bandgap than the base layer in order to further transmit more light through the emitter layer to the base layer before the light can be absorbed to create electron-hole pairs.

In some specialized cells, a thin, often intrinsic layer (not shown) may be placed between the emitter layer 72 and base layer 74, which may have the same composition as either the emitter layer 72 and/or the base layer 74, or may have a composition that may be distinct from either. This thin layer at the p-n junction, often called an 'intrinsic layer' if it is undoped, can serve to suppress shunting at the p-n junction, and can reduce the interface state density at the p-n junction in order to suppress minority-carrier recombination in the space-charge region. Similar to the base layer 74, the emitter layer 72 may also be intrinsic or not-intentionally-doped over part or all of its thickness, but if this intrinsic region can be positioned adjacent to the p-n junction, it may typically be considered part of the base layer 74 or as a separate intrinsic layer, described above, between the base layer 74 and emitter layer 72.

The BSF layer 75 can be analogous to the window layer 71 in that the BSF layer 75 passivates the base layer 74 of the photovoltaic cell 70. The BSF layer 75 typically has the same doping type as the base layer 74, often has a higher doping concentration than the base layer 74, and may be desirable to have a higher bandgap than the base layer 74, to suppress minority-carrier photogeneration and injection in the BSF layer 75 and to reduce recombination in the BSF layer 75. The photovoltaic cell 70 may be a subcell in a multijunction cell that can be positioned above other active subcells in the multijunction cell stack, in order to transmit more light through the BSF layer 75 to the active subcells beneath where the photogenerated electron-hole pairs can be collected more efficiently.

Although the window layer 71, the emitter layer 72, the base layer 74, and the BSF layer 75 in the PV cell 70 are shown as single layers, each of these layers may comprise more than one layer, with different composition, bandgap, growth method, or other distinguishing characteristic. For example, the window of the Ga(In)As-base middle cell in a multijunction cell 10 as depicted in FIG. 1, may consist of a GaInP first window layer 41, and a AlInP second window layer (not shown) with higher bandgap than the GaInP first window layer, in order to passivate (reduce minority-carrier recombination at) the upper surface of the GaInP first window layer.

Figure 3:
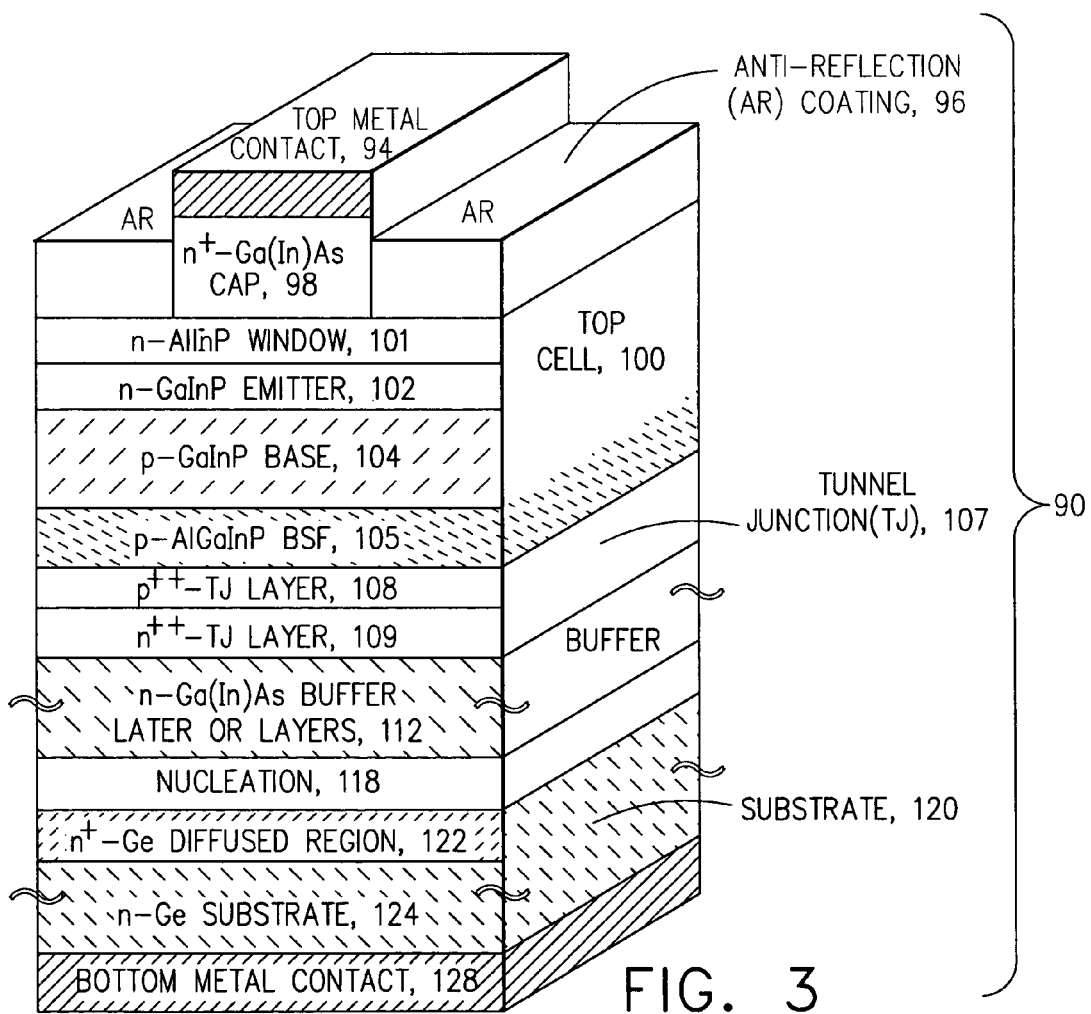
FIG. 3 is a cross-section of a single-junction photovoltaic cell comprising the basic semiconductor layer structure of the photovoltaic cell shown in FIG. 2, as well as other layers needed to form a complete device in accordance with the present invention.

In order to be used practically, the basic semiconductor layer structure of the PV cell 70 should be used in a complete device such as MJ cell 10 or a single-junction cell 90 described in FIG. 3. The PV cell 70 typically has structures deposited on, attached to, or otherwise added to it that allow it to be electrically connected to an external circuit. In the MJ cell 10, these include a heavily-doped cap contacting layer 18 on top of the window layer 21 of the top GaInP subcell 20, and a metal contact 14 on top of the cap layer 18, forming the top contact structure of the MJ cell 10. The back contact structure of the MJ cell 10 may include a bottom metal contact 68 on the bottom of the Ge subcell and substrate 60, and may or may not include a heavily-doped region at the back of the Ge subcell and substrate 60 to decrease the specific contact resistance at the interface with the bottom metal contact 68.

Referring now to FIG. 3, a complete single-junction PV cell 90 is depicted. The PV cell 90 may include a subcell 100 (similar to subcell 20 and cell 70) which comprises a AlInP window layer 101, a GaInP emitter layer 102, a GaInP base layer 104, and a AlGaInP BSF layer 105. A tunnel junction 107, disposed below the AlGaInP BSF layer 105 may include a $p^{++}$-doped side 108 and a $n^{++}$-doped side 109. A buffer region 112, connected to a nucleation layer 118, connected to an inactive substrate 120 which may comprise a Ge diffused region 122 and a Ge substrate 124, which can be connected to a bottom metal contact 128. The AlInP window layer 101 may be connected to a Ga(In)As cap 98 (which can further connect to a metal contact 94) and to an anti-reflection coating 96.

In one embodiment, a solar cell system, comprises a solar array having at least one solar cell, the solar cell comprising a disordered AlInP top subcell window layer, a disordered GaInP top subcell emitter layer disposed below the AlInP top subcell window layer, a disordered GaInP top subcell base layer disposed below the GaInP top subcell emitter layer, a disordered AlGaInP top subcell BSF layer disposed below the GaInP top subcell base layer, a tunnel junction comprising a disordered GaInP tunnel junction layer disposed below the top subcell BSF layer, a disordered GaInP, AlInP or AlInP/GaInP middle subcell window layer disposed below the tunnel junction below the top subcell BSF layer, a disordered GaInP BSF layer disposed below the Ga(In)As middle subcell base layer, a disordered GaInP nucleation layer and window layer disposed below the Ga(In)As buffer layer, and further comprising a Ge bottom subcell base layer and high-miscut-angle substrate disposed below the Ge bottom subcell emitter layer, the substrate comprising a (115) surface.

In another embodiment, a satellite system may comprise a satellite and a solar cell array operably coupled to the satellite, the solar cell array having at least one photovoltaic cell comprising a disordered AlInP window layer, a partially disordered GaInP subcell disposed below the AlInP window layer, the GaInP subcell comprising a bandgap of about 1.9 eV, a disordered AlGaInP BSF layer disposed below the GaInP subcell, a disordered GaInP tunnel junction layer disposed below the AlGaInP BSF layer, a Ga(In)As buffer layer disposed below the GaInP tunnel junction layer, a disordered GaInP nucleation layer and window layer disposed below the Ga(In)As buffer layer, a Ge diffused region layer disposed below the GaInP nucleation layer and window layer, and an about 16 degree miscut Ge substrate disposed below the Ge diffused region layer.

Non-anti-reflection coated, 2-junction GaInP/1%-In GaInAs cells on 15.8 degree-miscut Ge substrates have a measured open-circuit voltage ($V_{oc}$) averaged over a number of experimental cells, that is about 48 mV higher than comparable cells built on 6 degree-miscut substrates with GaInP top subcell bases partially disordered by Zn diffusion from a heavily-Zn-doped AlGaInP top subcell BSF layer. Further, the $V_{oc}$ is about 92 mV higher than for comparable cells built on 6 degree-miscut substrates having GaInP top subcell bases with nearly complete group-III sublattice ordering due to the absence of Zn diffusion, corresponding closely to difference in the bandgap of the GaInP top subcell bases. The higher voltage and more favorable division of the solar spectrum results in higher measured non-anti-reflection coated, 2-junction AM0 (space) solar spectrum efficiency of 19.23% (corresponding to a projected average of about 29% efficiency for fully-processed, anti-reflection coated, 3-junction cells) for the 15.8 degree-miscut Ge as compared to conventional 6 degree-miscut Ge. This represents a 3.3% relative improvement over the 18.61% efficiency of the cells with partially-disordered GaInP top subcell bases, and 6.3% relative improvement over the 18.08% efficiency of cells with nearly complete ordering in the GaInP top subcell base.

Figure 4:
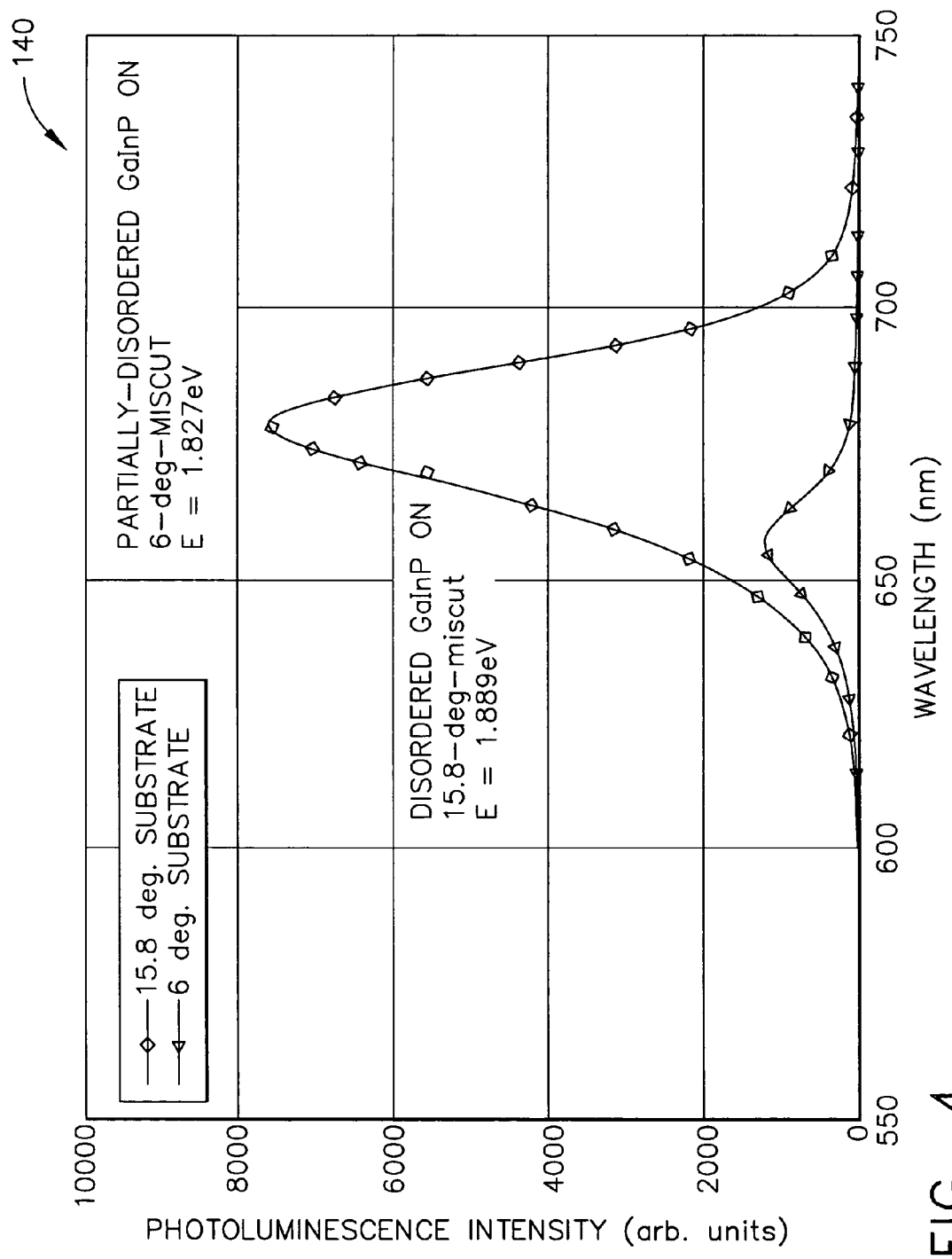
FIG. 4 is a graph depicting photoluminescence measurements of a GaInP subcells grown on 15.8°-miscut and 6°-miscut substrates in accordance with the present invention.

These benefits are also retained for fully-processed 3-junction solar cells. Referring now to FIG. 4, a chart 140 depicts the photoluminescence measurements of the GaInP top subcell for two types of 3-junction (3J) cells. One 3J cell is grown on a 15.8 degree-miscut (high-miscut-angle) Ge substrate, where the miscut angle is toward a {111} plane, resulting in a {511} orientation of the wafer surface, in order to disorder the group-III sublattice and increase the bandgap of the GaInP top subcell, in accordance with the present invention. The other 3J cell is grown on a conventional 6 degree-miscut Ge substrate, which would normally result in a highly-ordered, low-bandgap (about 1.8 eV) GaInP top subcell. In this particular cell, a conventional method of partially increasing the GaInP top subcell disorder, Zn diffusion in the GaInP base, has been used to increase the bandgap of the GaInP base somewhat above its value for fully-ordered GaInP. The shift of the photoluminescence (PL) peak to higher energy for the GaInP subcell grown on the high-miscut-angle substrate can be observed in the chart 140. Taking the photon energy of the peak intensity of the PL curve as a close approximation of the bandgap energy, the GaInP top subcell grown on a 15.8 degree-miscut substrate has an about 1.889 eV bandgap due to almost complete disordering of the group-III sublattice by the substrate miscut angle, while the bandgap of the GaInP top subcell grown on a conventional 6 degree-miscut substrate, partially-disordered by Zn diffusion into the GaInP base from a heavily-Zn-doped AlGaInP back-surface field (BSF) layer, may be about 1.827 eV, or 0.062 eV lower than the fully-disordered case on a 15.8 degree-miscut substrate.

Figure 5:
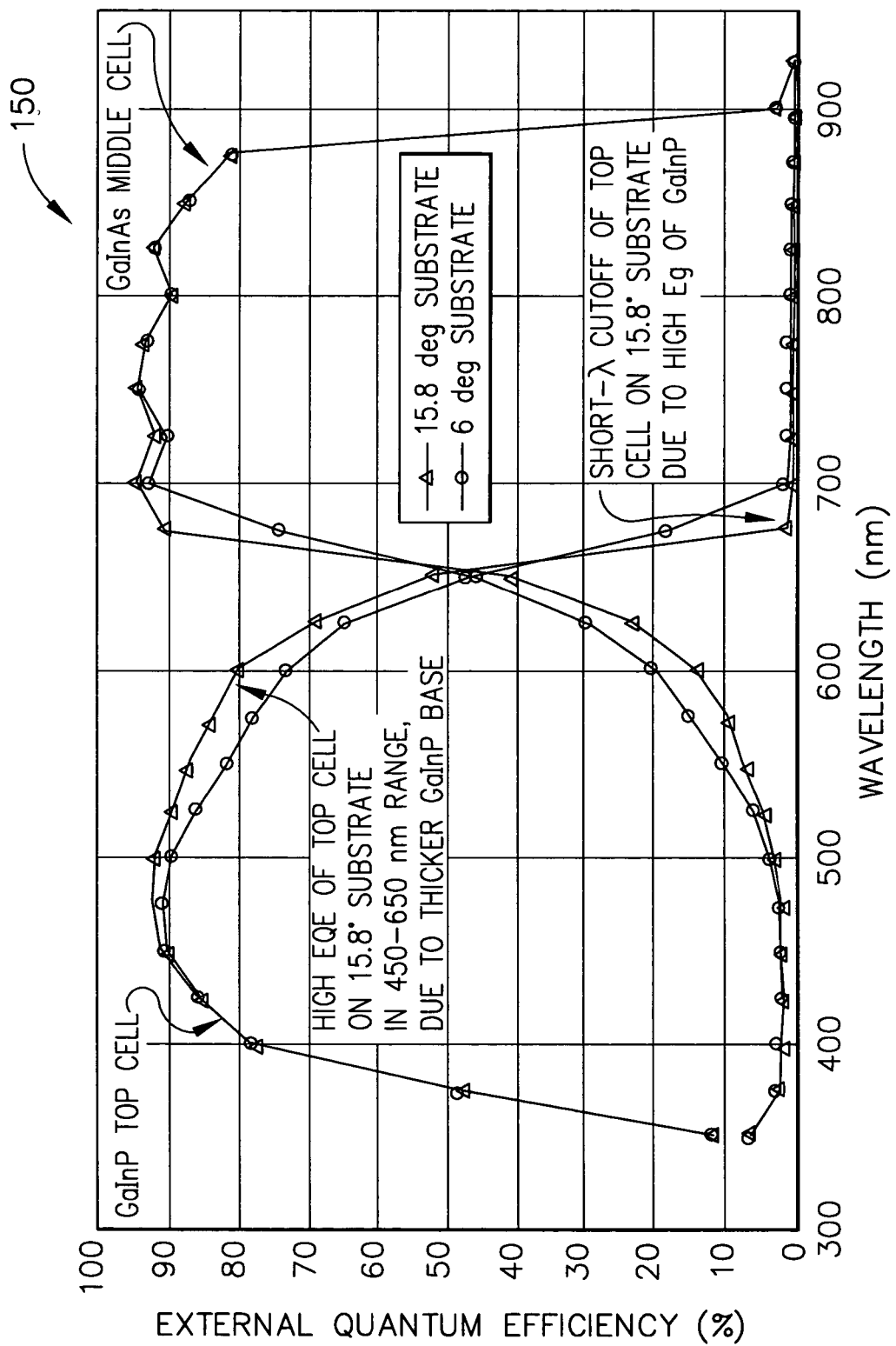
FIG. 5 is a graph depicting external quantum efficiency measurements of GaInP subcells grown on 15.8°-miscut and 6°-miscut substrates in accordance with the present invention.

This difference in GaInP top subcell bandgap can be observed in external quantum efficiency (EQE) measurements of the two types of GaInP subcells grown on 15.8 degree-miscut and 6 degree-miscut substrates, shown in a chart 150 depicted in FIG. 5. The top subcell quantum efficiency can be seen to have a shorter cutoff wavelength for the 15.8 degree-miscut case, reaching close to zero EQE by 675 nm for the 15.8 degree-miscut substrate, due to the high GaInP bandgap resulting from disordering on this substrate, compared to 700 nm for the 6 degree-miscut substrate case. Since the longest wavelengths that can be used by the top subcell in the 6 degree-miscut case can no longer be used in the 15.8 degree-miscut case, the GaInP top subcell base has been thickened in order to bring the photogenerated current density in the top subcell back up to the point at which it can be current matched to the 1%-In GaInAs middle cell. The greater thickness of the top subcell increases the light absorption at long wavelengths, that still correspond to photon energies above the bandgap of the disordered GaInP top subcell in the 15.8°-miscut substrate (in the wavelength range from approximately 500 nm to 650 nm).

Figure 6:
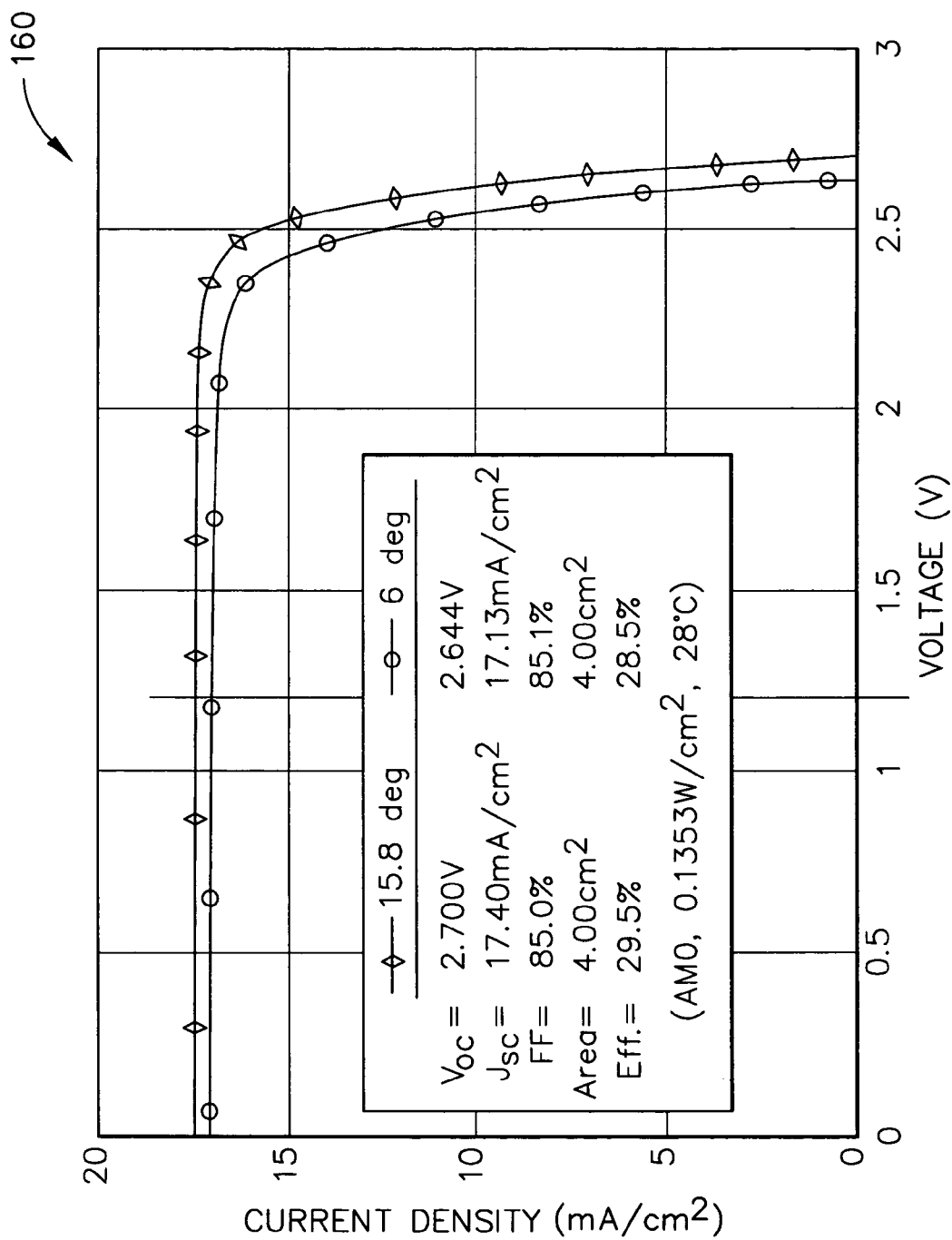
FIG. 6 is a graph depicting illuminated current-voltage characteristics of fully-processed 3-junction cells comprising GaInP subcells grown on 15.8°-miscut and 6°-miscut substrates in accordance with the present invention.

The illuminated current-voltage characteristics of fully-processed 3-junction cells on a 15.8 degree-miscut and a 6 degree-miscut substrate are presented in a chart 160 of FIG. 6. The indicator of performance that may be most significant for a solar cell can be the conversion efficiency. As a result of the present invention, the 3-junction cell on a 15.8 degree-miscut substrate has a markedly higher efficiency of 29.5% under the AM0 solar spectrum, than that of a comparison cell on a 6 degree-miscut substrate at 28.5%. The 15.8 degree-miscut substrate cell of the present invention thus produces 3.5 relative percentage more power per unit area than the 6 degree-miscut cell. The higher bandgap resulting from the greater disorder of the group-III sublattice in the GaInP top subcell in the 15.8 degree-miscut case increases the $V_{oc}$ to about 2.700 V, or 56 mV higher than the 2.644 V $V_{oc}$ of the 6 degree-miscut case with a GaInP top cell that is only partially disordered. The short-circuit current density $J_{sc}$ can also be seen to be higher in the 15.8 degree-miscut case than for the 6 degree-miscut, with the fill factor nearly the same for the two cases.

The 3.5% higher power of the 3-junction cell of the present invention, with a high-bandgap, disordered GaInP top subcell on a 15.8 degree-miscut substrate, strongly leverages the cost of cells, weight of space solar panels, weight of panel support structures, stowage volume, and launch costs for spacecraft utilizing such cells. For terrestrial solar cells, the higher efficiency of the 3-junction cell of the present invention on a 15.8 degree-miscut substrate leverages not only the cost of the multijunction cell, the highest single cost component of terrestrial concentrator systems for electricity generation, but also reduces the cost of the concentrating optics, support structures, and other balance-of-system costs.

In one embodiment of the present invention, a method for increasing a GaInP top subcell bandgap comprises providing a Ge substrate with a 15.8 degree miscut angle, growing a photovoltaic cell, including the GaInP top subcell, on the Ge substrate, and positioning the miscut angle toward a {111} plane resulting in a {511} orientation of the substrate surface thus disordering and increasing the bandgap of the GaInP top subcell.

In another embodiment of the present invention, a method for producing an external quantum efficiency short cutoff wavelength for a GaInP top subcell comprises disordering a Ge substrate by a 15.8 degree miscut angle, and growing the GaInP top subcell on the disordered Ge substrate, resulting in a high bandgap and a quantum efficiency cutoff wavelength percentage of about zero by about 675 nm.

In a further embodiment of the present invention, a method for increasing a conversion efficiency in a solar cell comprises misorienting a Ge substrate surface by a 15.8 degree miscut angle from a {100} pland toward a {111} plane, and growing a GaInP top subcell with a highly disordered group-III sublattice and corresponding high bandgap on the misoriented Ge substrate, resulting in an efficiency of about 29.5% and an open-circuit voltage of about 2.7V.

The present invention, describing a high-efficiency MJ photovoltaic cell resulting from an increased bandgap of the GaInP subcell due to an increased sublattice disorder induced by growth on a high-miscut-angle substrate misoriented from a (100) plane toward a (111) plane, may be used advantageously in both single-junction and multijunction solar cells. The present invention may be used to benefit the window layer, emitter layer, base layer, or the BSF layer of any subcell or any combination of subcells. The improved window, emitter, base, or BSF layers may be used in combination with each other in the same single-junction photovoltaic subcell, in the same subcell of a multijunction cell, in different subcells of a multijunction cell, or in different regions of other optoelectronic devices. In general, the present invention may also be applied to other layers of the multijunction cell, such as cap layers, buffer layers, nucleation layers, tunnel junction layers, intrinsic layers between base and emitter, and partial thicknesses of window, emitter, base, BSF, or any of the above types of photovoltaic cell layers.

It should be understood, of course, that the foregoing relates to preferred embodiments of the invention and that modifications may be made without departing from the spirit and scope of the invention as set forth in the following claims.

We claim:

1. A photovoltaic cell, comprising:
   a GaInP subcell comprising a disordered group-III sublattice base;
   a GaInAs subcell disposed below the GaInP subcell; and
   a semiconductor growth substrate disposed below the GaInAs subcell wherein said semiconductor growth substrate is lattice matched to said GaInP subcell, said semiconductor growth substrate comprising a surface misoriented from a (100) plane by an angle from about 8 degrees to about 40 degrees toward a nearest (111) plane, wherein said angle optionally consists of an angle of 15.8 degrees and said surface consists of a (115) surface orientation;
   wherein the angle produces a bandgap in the GaInP subcell such that the GaInP subcell and the GaInAs subcell exhibit substantially equal current densities, wherein a thickness of said GaInP subcell base is selected to provide current matching to said GaInAs subcell, said thickness corresponding to an increased amount of disorder in the sublattice of said base; and,
   wherein said semiconductor growth substrate orientation is combined with one or more alternative methods of inducing sublattice disorder in the GaInP sublattice to achieve a selected amount of said sublattice disorder in said GaInP sublattice.

2. The photovoltaic cell of claim 1, wherein the semiconductor growth substrate comprises a surface misoriented from the (100) plane by an angle from about 14 degrees to about 18 degrees toward the nearest (111) plane.

3. The photovoltaic cell of claim 1, wherein the semiconductor growth substrate comprises a surface misoriented from the (100) plane by an angle of about 16 degrees toward the nearest (111) plane.

4. The photovoltaic cell of claim 1, wherein the semiconductor growth substrate is a Ge substrate.

5. The photovoltaic cell of claim 4, wherein the Ge substrate is also an active subcell of the multijunction photovoltaic cell.

6. The photovoltaic cell of claim 1, wherein the semiconductor growth substrate is a GaAs substrate.

7. The photovoltaic cell of claim 1, wherein said alternative method is selected from the group consisting of Zn doping of said GaInP subcell, Zn diffusion of in said GaInP subcell, point defect diffusion in said GaInP subcell, altered epitaxial growth conditions of said of said GaInP subcell, and the addition of surfactants during epitaxial growth of said GaInP subcell.

8. A photovoltaic cell, comprising:
   a GaInP subcell comprising a disordered group-III sublattice base;
   a GaInAs subcell disposed below the GaInP subcell; and
   a semiconductor growth substrate disposed below the GaInAs subcell wherein said semiconductor growth substrate is lattice matched to said GaInP subcell, said semiconductor growth substrate comprising a surface misoriented from a (100) plane by an angle from about 8 degrees to about 40 degrees toward a nearest (111) plane, wherein said angle optionally consists of an angle of 15.8 degrees and said surface includes a (115) surface orientation but excludes a (511) surface orientation;
   wherein the angle produces a bandgap in the GaInP subcell such that the GaInP subcell and the GaInAs subcell exhibit substantially equal current densities, wherein a thickness of said GaInP subcell base is selected to provide current matching to said GaInAs subcell, said thickness corresponding to an increased amount of disorder in the sublattice of said base; and,
   wherein said semiconductor growth substrate orientation is combined with one or more alternative methods of inducing sublattice disorder in the GaInP sublattice to achieve a selected amount of said sublattice disorder in said GaInP sublattice.

9. The photovoltaic cell of claim 8, wherein the semiconductor growth substrate comprises a surface misoriented from the (100) plane by an angle from about 14 degrees to about 18 degrees toward the nearest (111) plane.

10. The photovoltaic cell of claim 8, wherein the semiconductor growth substrate comprises a surface misoriented from the (100) plane by an angle of about 16 degrees toward the nearest (111) plane.

11. The photovoltaic cell of claim 8, wherein the semiconductor growth substrate is a Ge substrate.

12. The photovoltaic cell of claim 11, wherein the Ge substrate is also an active subcell of the multijunction photovoltaic cell.

13. The photovoltaic cell of claim 8, wherein the semiconductor growth substrate is a GaAs substrate.

14. The photovoltaic cell of claim 8, wherein said alternative method is selected from the group consisting of Zn doping of said GaInP subcell, Zn diffusion of in said GaInP subcell, point defect diffusion in said GaInP subcell, altered epitaxial growth conditions of said of said GaInP subcell, and the addition of surfactants during epitaxial growth of said GaInP subcell.

* * * * *